(12) United States Patent
Faul (10) Patent No.: US 10,224,342 B2
(45) Date of Patent: Mar. 5, 2019

(54) TUNABLE CAPACITOR FOR FDSOI APPLICATIONS

(71) Applicant: GLOBALFOUNDRIES Inc., Grand Cayman (KY)

(72) Inventor: Juergen Faul, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 25 days.

(21) Appl. No.: 15/644,968

(22) Filed: Jul. 10, 2017

(65) Prior Publication Data

US 2017/0309643 A1 Oct. 26, 2017

Related U.S. Application Data

(62) Division of application No. 14/750,236, filed on Jun. 25, 2015, now Pat. No. 9,748,270.

(51) Int. Cl.
| | |
|---|---|
| H01L 27/12 | (2006.01) |
| H01L 29/93 | (2006.01) |
| H01L 21/84 | (2006.01) |
| H01L 29/786 | (2006.01) |
| H01L 27/11582 | (2017.01) |
| H01L 49/02 | (2006.01) |

(52) U.S. Cl.
CPC .......... *H01L 27/1203* (2013.01); *H01L 21/84* (2013.01); *H01L 27/11582* (2013.01); *H01L 28/00* (2013.01); *H01L 29/78603* (2013.01); *H01L 29/78648* (2013.01); *H01L 29/93* (2013.01)

(58) Field of Classification Search
CPC .................................................. H01L 27/1248
See application file for complete search history.

(56) References Cited

U.S. PATENT DOCUMENTS

| | | | |
|---|---|---|---|
| 2006/0027877 A1 | 2/2006 | Inaba | |
| 2009/0057746 A1 | 3/2009 | Sugll et al. | |
| 2010/0232077 A1 | 9/2010 | Worley | |
| 2012/0083080 A1 | 4/2012 | Shifren et al. | |
| 2015/0061006 A1* | 3/2015 | Shinohara | H01L 29/7824 257/336 |
| 2015/0364470 A1* | 12/2015 | Yamaji | H01L 27/0921 257/372 |

* cited by examiner

*Primary Examiner* — Trang Q Tran
(74) *Attorney, Agent, or Firm* — Amerson Law Firm, PLLC (57) ABSTRACT

A semiconductor device includes an SOI substrate having a base substrate material, an active semiconductor layer positioned above the base substrate material and a buried insulating material layer positioned between the base substrate material and the active semiconductor layer. A gate structure is positioned above the active semiconductor layer and a back gate region is positioned in the base substrate material below the gate structure and below the buried insulating material layer. An isolation region electrically insulates the back gate region from the surrounding base substrate material, wherein the isolation region includes a plurality of implanted well regions that laterally contact and laterally enclose the back gate region and an implanted isolation layer that is formed below the back gate region.

17 Claims, 10 Drawing Sheets

TUNABLE CAPACITOR FOR FDSOI APPLICATIONS

BACKGROUND

1. Field of the Disclosure

The present disclosure generally relates to semiconductor devices in SOI applications, and, more particularly, to tunable capacitors for FDSOI applications.

2. Description of the Related Art

At present, varactor diodes are used as tunable capacitors in VCO (voltage controlled oscillator) designs. VCOs have many applications, such as frequency modulation for FM transmitters and phase-locked loops. For example, phase-locked loops are used for frequency synthesizers that tune many radios, television sets and cellular telephones.

Conventionally, varactor diodes or varicap diodes are operated in a reverse biased state where no current flows. However, since the thickness of the depletion zone of the varactor diode varies with an applied bias voltage, the capacitance of the diode can be varied. The typical varactor may be formed by a depletion layer provided via a PN junction. As the depletion layer may be made of a MOS or a Schottky diode, the varactor may be implemented in CMOS or MIMIC technologies.

U.S. Patent Publication No. 2009/0057746 shows the parallel integration of a varactor and a CMOS structure in SOI techniques.

The task of complying with Moore's law drives a scaling of semiconductor devices at present to more advanced technology nodes, particularly at 20 nm and beyond, in a continuous effort to develop more and more compact semiconductor devices. However, as induced by the scaling, shorts are caused between adjacent P-type back gates when a back bias for tuning the varactor is applied with shrinking separation between neighboring semiconductor devices because a separation between neighboring back gates used for tuning the varactor and possibly other CMOS devices in the vicinity to the varactor, such as conventionally used P-type varactors having a P-type back gate formed in a P-type base substrate of an SOI substrate, is hereby steadily reduced.

From the above, it is, therefore, desirable to provide a semiconductor device structure that avoids the problems as indicated above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

The presently disclosed subject matter is generally directed to semiconductor devices in SOI applications, and, more particularly, to tunable capacitors for FDSOI applications. In one illustrative embodiment, an exemplary semiconductor device includes an SOI substrate having a base substrate material, an active semiconductor layer positioned above the base substrate material and a buried insulating material layer positioned between the base substrate material and the active semiconductor layer. The disclosed semiconductor device further includes, among other things, a gate structure that is positioned above the active semiconductor layer and a back gate region that is positioned in the base substrate material below the gate structure and below the buried insulating material layer. Additionally, an isolation region electrically insulates the back gate region from the surrounding base substrate material, wherein the isolation region includes a plurality of implanted well regions that laterally contact and laterally enclose the back gate region and an implanted isolation layer that is formed below the back gate region.

In another exemplary embodiment, a semiconductor device is disclosed that includes, among other things, an SOI substrate that includes a base substrate material, an active semiconductor layer positioned above the base substrate material and a buried insulating material layer positioned between the base substrate material and the active semiconductor layer. Additionally, the illustrative semiconductor device further includes a doped back gate region that is positioned below the buried insulating material layer, wherein the doped back gate region includes dopant of a first conductivity type. Furthermore, a plurality of doped well regions are positioned in the base substrate material and laterally enclose the doped back gate region, wherein the plurality of doped well regions are doped with dopant of a second conductivity type that is opposite to the first conductivity type, and a doped isolation region is positioned in the base substrate material below the doped back gate region, wherein the doped isolation region is doped with dopant of the second conductivity type. Moreover, a gate structure is positioned above the active semiconductor layer and over the doped back gate region.

A further illustrative embodiment disclosed herein is directed to a semiconductor device that includes an SOI substrate, wherein the SOI substrate includes a base substrate material, an active semiconductor layer positioned above the base substrate material and a buried insulating material layer positioned between the base substrate material and the active semiconductor layer. The semiconductor device further includes a doped back gate region that is positioned in the base substrate material, wherein the doped back gate region includes a dopant of a first conductivity type. Additionally, a plurality of doped well regions are positioned in the base substrate material and laterally enclose the doped back gate region, wherein the plurality of doped well regions are doped with a dopant of a second conductivity type that is opposite to the first conductivity type, and a doped isolation region is positioned in the base substrate material below the doped back gate region, wherein the doped isolation region is doped with dopant of the second conductivity type. The disclosed semiconductor device also includes a gate structure that is positioned above the active semiconductor layer and over the doped back gate region and a first doped region positioned within the active semiconductor layer, wherein the first doped region includes dopant of the second conductivity type. Furthermore, the semiconductor device includes second doped regions that contact the first doped region within the active semiconductor layer and are substantially aligned with the gate structure so as to form a capacitor structure between the gate structure and the first doped region, wherein the second doped regions include dopant of the second conductivity type and have a dopant concentration that is greater than the concentration of the dopant of the second conductivity type in the first doped region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a cube" should be interpreted in similar fashion.

Figure 1:
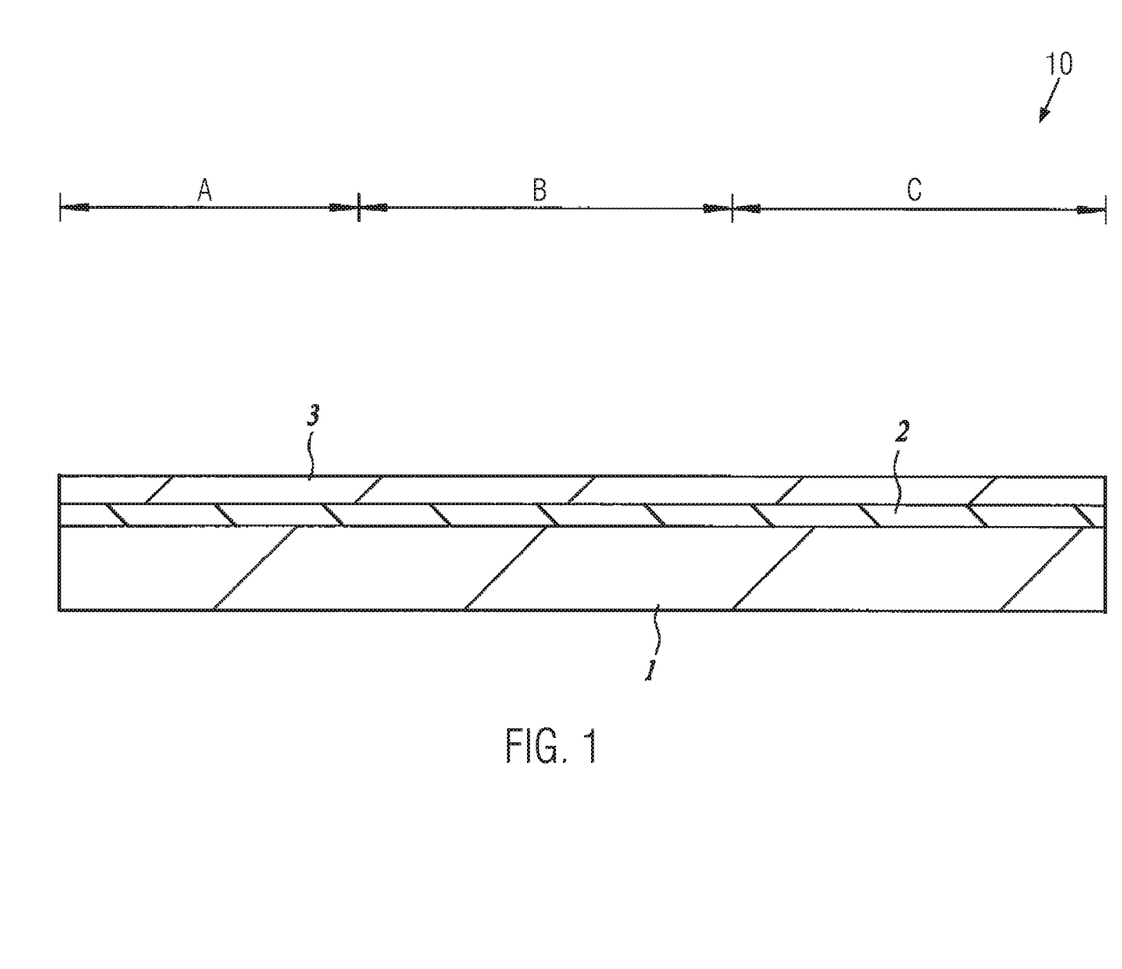
FIGS. 1-10 are schematic cross-sectional views that illustrate fabrication of a semiconductor device structure in accordance with various illustrative embodiments of the present disclosure.

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," and the like—have been included so as to provide additional clarity to the description, and should be construed in light of that term's normal and everyday meaning relative to the depiction of the components or elements in the referenced figures. For example, referring to the cross-sectional view of the in-process device depicted in FIG. 1, it should be understood that the active semiconductor layer 3 is depicted as being positioned "above" base substrate material 1, and the buried insulating material layer 2 is depicted as being positioned "below" the active semiconductor layer 3 and "above" the base substrate material 1. Additionally, the "top" or "upper" surface of the active semiconductor layer 3 as shown in FIG. 1 is depicted as being substantially "horizontally" oriented, and in the cross-sectional view of FIG. 2, the device isolation trenches 4 are shown as extending "below" the "bottom" or "lower" surface of the buried insulating material layer 2.

Generally, the present disclosure relates to methods of forming semiconductor devices and to the resulting semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example, smaller than 50 nm or smaller than 35 nm, e.g., at 28 nm or below. The person skilled in the art will appreciate that according to the present disclosure, ground rules smaller or equal to 45 nm, e.g., at 28 nm or below, may be imposed. The person skilled in the art will appreciate that the present disclosure proposes semiconductor devices with structures of minimal length dimensions and/or width dimensions smaller than 100 nm, for example, smaller than 50 nm or smaller than 35 nm or smaller than 28 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In general, FDSOI devices have a thin active semiconductor layer disposed on a buried insulating material layer, which, in turn, is formed on a base substrate material. In accordance with some illustrative embodiments herein, the active semiconductor layer may comprise one of silicon, silicon germanium and the like. The buried insulating material layer may comprise an insulating material, e.g., silicon oxide or silicon nitride. The base substrate material may be a base material that is used as a substrate in the art, e.g., silicon and the like. The person skilled in the art will appreciate that, in accordance with FDSOI substrates, the active semiconductor layer may have a thickness of 20 nm or less, while the buried insulating material layer may have a thickness of about 145 nm or, in accordance with advanced techniques, the buried insulating material layer may have a thickness in a range from 10-30 nm. For example, in some illustrative embodiments of the present disclosure, the active semiconductor layer may have a thickness of 6-10 nm.

As to a plane orientation of the base substrate material, similar to that of an ordinary silicon device, an SOI substrate whose surface is a face (100) is usually used. However, in order to improve performance of a PMOS semiconductor device, a surface of the PMOS semiconductor device may be used as a face (110), or a hybrid plane orientation substrate whose surface is mixed by a face (100) and a face (110) may be used. With regard to a varactor device, there is no restriction on a crystal plane orientation, so that an impurity concentration, film thickness, dimension ratio of the device and the like may be appropriately adjusted to obtain a capacitance characteristic that is suitable according to the plane orientation set by other requirements. In alternative embodiments, the base substrate material may be of an N-type when N-accumulation and/or N-inversion devices are considered.

The person skilled in the art will appreciate that the present disclosure provides, in some aspects, a tunable MOS capacitor formed in an SOI region. According to special illustrative embodiments herein, an active semiconductor material of the SOI region may be lightly N-doped, while an N-stack may be formed on top of the lightly doped N-region, e.g., by an N-metal which allows increasing performance in view of a poly SiON gate stack where the depletion zone formed in the bottom of the gate stack material may lower performance. The capacitance of the tunable MOS capacitor may be tuned by a back gate formed in a base substrate material of the SOI region. According to some special illustrative examples herein, a P-back gate may be used to accumulate/deplete charges of the N-doped and an according tunable MOS capacitor may, for example, be employed as a tunable capacitor in VCO applications. In this way, a high terminal control at the gate, a low control at source/drain, and a voltage control at a fourth terminal are achieved.

With regard to FIGS. 1-10, a manufacturing method for a semiconductor device according to the present disclosure will be described. Herein, regions shown by the reference numerals "A" to "C" in each figure are FDSOI device forming regions. Among them, a region A represents one of an NMOS transistor forming region and one of a PMOS transistor forming region. A region B represents a MOS varactor forming region. A region C may form one of an NMOS transistor forming region, a PMOS transistor forming region, a resistor forming region and a bulk device forming region. The person skilled in the art will appreciate that, for simplifying the following discussion, the region C is described as a resistor forming region, though it lies within the scope of the skilled person to form a MOS transistor or a bulk semiconductor device in region C.

FIG. 1 schematically shows in a cross-sectional view a semiconductor device structure 10 at a very early stage during fabrication of semiconductor devices (not illustrated), particularly, when an SOI substrate (reference numerals 1, 2, 3 in FIG. 1) is provided. As shown in FIG. 1, the SOI substrate comprises a base substrate material 1, a buried insulating material layer 2 and an active semiconductor layer 3. In accordance with illustrative embodiments of the present disclosure, the base substrate material 1 may be formed of P-type monocrystalline silicon having a plane orientation of (100). The active semiconductor layer 3 may be formed, for example, of P-type monocrystalline silicon having a plane orientation (100), a crystal orientation (110) or (100) parallel to an orientation flat or notch, and a thickness of 30 nm or less. In accordance with some illustrative embodiments of the present disclosure, the buried insulating material layer 2 may be formed of an oxide silicon film having a thickness of 10 nm or less.

Figure 2:
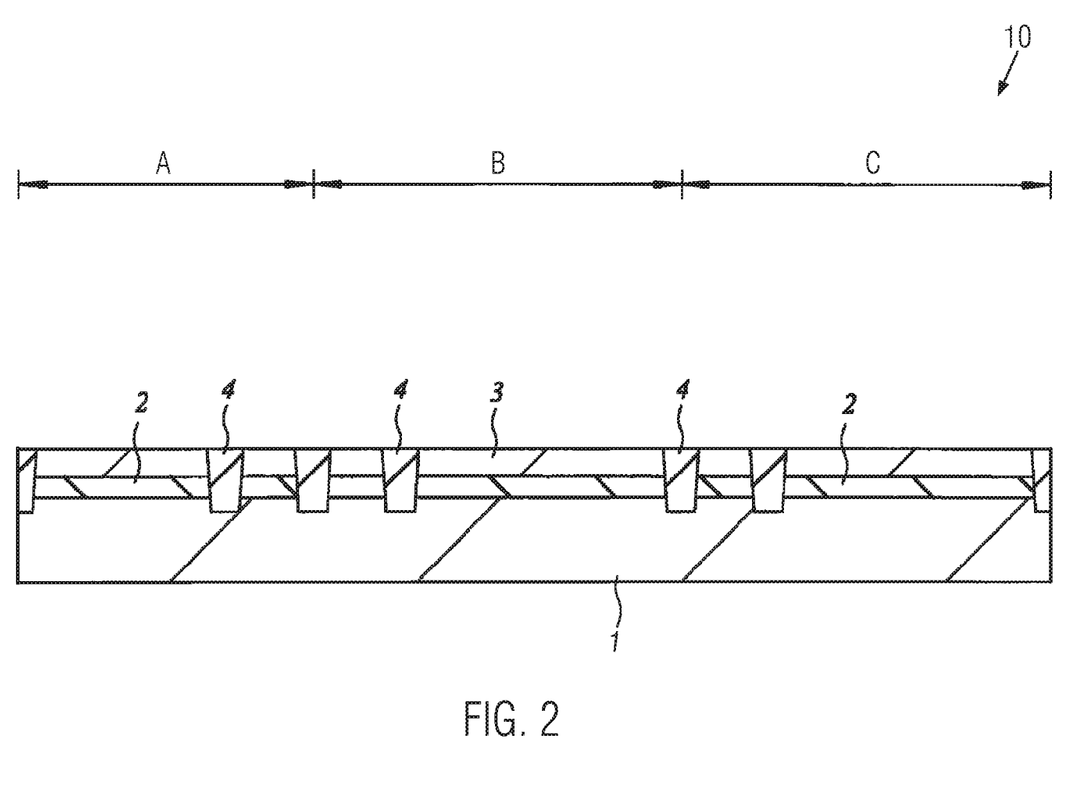

Next, as shown in FIG. 2, device isolation trenches 4 extending from a surface of the active semiconductor layer 3 to the base substrate material 1 are formed. The device isolation trenches 4 may have a depth of approximately 300 nm or less and may be formed by using well known STI (shallow trench isolation) techniques.

Figure 3:
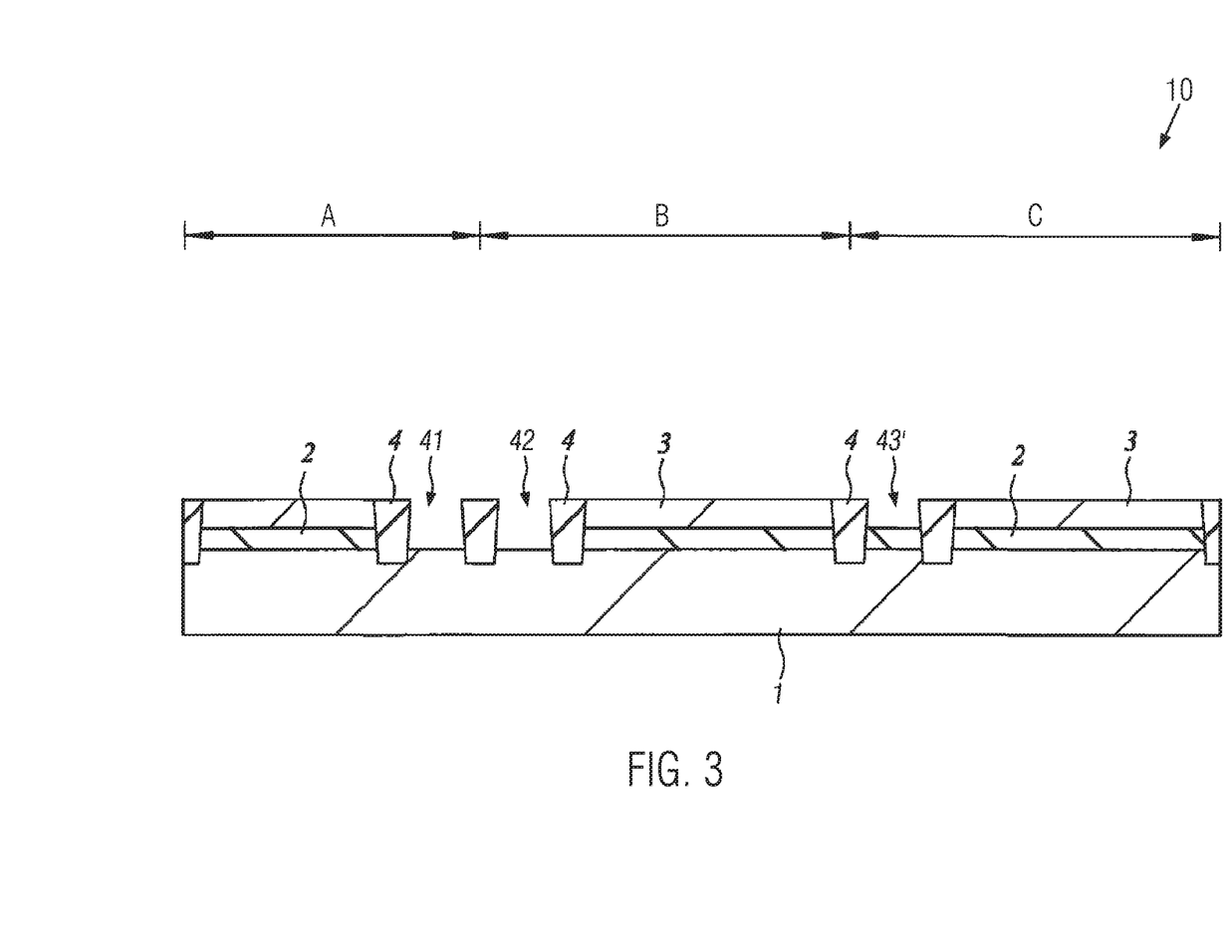

With regard to FIG. 3, the surface of the base substrate material 1 is, at a more advanced stage during fabrication, exposed to a dry etching and a wet etching process such that the active semiconductor layer 3 and the buried insulating material layer 2 in the region between some of the device isolation trenches 4 is removed, leaving trenches 41, 42 and 43'. The trenches 41 and 42 are formed such that the base substrate material 1 is exposed in the trenches 41, 42. With regard to the trench 43', the active semiconductor layer 3 is removed, while the buried insulating material layer 2 lies exposed.

Figure 4:
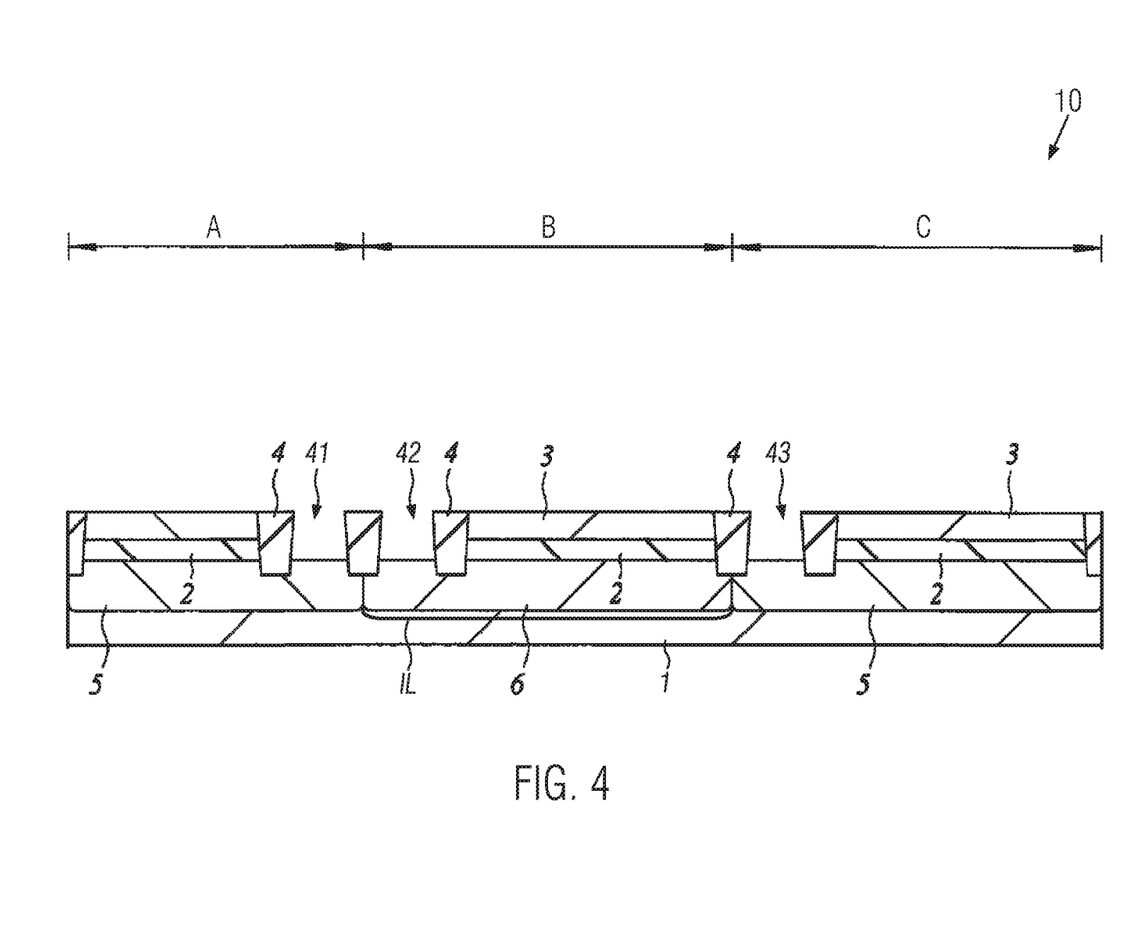

With regard to FIG. 4, a more advanced stage during fabrication of the semiconductor device structure 10 is illustrated. Particularly, the semiconductor device structure 10 is illustrated at a phase during fabrication in which the buried insulating material 2 laying exposed in the trench 43' is removed such that the trench 43 is formed, wherein the base substrate material 1 lies exposed in the trench 43.

Subsequent to the formation of the trenches 41, 42 and 43, a process sequence comprising implantation processes is performed so as to form well regions 5 in the regions A, C, while a well region 6 is formed in the semiconductor device region B. The person skilled in the art will appreciate that appropriate masking techniques may be used for successively masking the regions A, B, C (e.g., in a first process step, region B may be masked, while regions A, C are exposed to subsequent processing and, in a second process step, regions A, C may be masked, while region B is exposed to further processing; the first process step may be followed by the second process step or vice versa). In accordance with illustrative embodiments, the well regions 5 and 6 represent back gate regions for applying a back gate bias in the fabricated semiconductor device structure 10. Accordingly, the well regions 5 and 6 will be referred to below as "back gate regions."

The back gate regions 5 are formed by implanting dopants of a first conductivity type into an upper surface region of the base substrate material 1 below the buried insulating material layer 2 within the semiconductor device regions A and C (while region B is covered by a masking structure). The back gate region 6 is formed by implanting dopants of a second conductivity type into an upper surface of the base substrate material 1 below the buried insulating material layer 2 in the semiconductor device region B (while regions A, C are masked). Herein, the dopants of the first conductivity type (either P or N) are of a conductivity type opposite to the conductivity type of the dopants of the second conductivity type (either N or P). The person skilled in the art will appreciate that the back gate regions 5 in the regions A and C are laterally disposed at opposing sides of the back gate region 6. Out of the plane that illustrates the sectional view in FIG. 4, further back gate regions of countertype doping relative to the back gate region 6 are disposed (not illustrated) such that the back gate region 6 is laterally enclosed by back gate regions of counterdoping.

As depicted in FIG. 4, an isolation layer IL is further formed below the back gate region 6 so as to electrically insulate the back gate region 6 from the surrounding base substrate material 1. The isolation layer IL may be formed in accordance with some illustrative embodiments of the present disclosure by implanting phosphor at an implantation energy of more than 500 keV, e.g., 510-530 keV, such as 519 keV, and at an implantation concentration of about $E13/cm^3$. For example, an implantation concentration may be in the range from 1.5-4.5 $E13/cm^3$, such as in a range from 2.0-3.0 $E13/cm^3$, e.g., at 2.8 $E13/cm^3$. The person skilled in the art will appreciate that these values are only provided for descriptive purposes and may vary in dependence on an actual thickness of the buried insulating material 2 and/or of the active semiconductor layer 3.

The person skilled in the art will appreciate that, in accordance with some illustrative embodiments of the present disclosure, the back gate region 6 is electrically insulated from the base substrate material 1 via a PN junction which is at least formed between the back gate region 6 and the isolation layer IL.

In accordance with some illustrative embodiments of the present disclosure, the fabrication process associated with FIG. 4 may include a first sequence of implantation processes where, by appropriate masking techniques, one of the back gate regions 5 and 6 is implanted. Herein, the regions A, C may be covered by an appropriate mask that is, for example, formed by lithographically patterning techniques applied to a photoresist (not illustrated) or a hard mask system (not illustrated). After having implanted the regions 5, the masking pattern (not illustrated) is removed and a second sequence of implantation processes is performed for implanting the back gate region 6. Herein, a masking pattern for covering the regions A and C may be formed such that the region B is exposed to the subsequent implantation. After having completed the formation of the back gate region 6, another implantation process is performed for providing the isolation layer IL in the region B. Thereafter, the masking pattern (not illustrated) may be removed.

The person skilled in the art will appreciate that, in accordance with some illustrative embodiments of the present disclosure, wherein the back gate region 6 is of a P-type, the adjacent back gate regions 5 and the isolation layer IL are provided as N-type isolation layers/regions. Accordingly, the back gate region 6 is electrically insulated from the surrounding base substrate material 1 and the surrounding back gate regions, as well as leakage currents that may possibly be triggered between the back gate region 6 and a further adjacent back gate region of P-type (not illustrated) are avoided.

Regarding the semiconductor device structure 10 as illustrated in FIG. 4, an optional doping of the active semiconductor layer 3 may be performed in at least one of the regions A, B and C. In accordance with some illustrative embodiments herein, the optional doping may be performed after the back gate regions 5, 6 and the isolation layer IL are formed. For example, the optional doping may comprise doping the active semiconductor layer 3 in at least one of the regions A to C with P-type or N-type dopants. In accordance with special illustrative examples herein, a possible (but not limiting) setup for P-type doping may involve boron implanted at 8 keV. An alternative (but not limiting) setup for N-type doping may involve phosphorus implanted at 5 keV. Illustrative doping concentrations are on the order of 17 $E/cm^3$.

In accordance with some explicitly disclosed (but not limiting) illustrative embodiments of the present disclosure, a process for forming a lightly-doped channel in the active semiconductor layer 3 of at least the region B may be performed. Herein, an implantation sequence may be performed for doping the active semiconductor layer 3 at least in the region B (e.g., by providing a masking structure such that at least the region B is exposed to the implantation sequence). In special examples herein, the implantation sequence may comprise an implantation step for implanting in the region B may comprise a dopant carrier gas $BF_2$ in the case of the implementation of P-type semiconductor devices, i.e., in cases where a P-type varicap is to be fabricated in the region B.

In accordance with some illustrative embodiments of the present disclosure, a region of the active semiconductor layer 3 at least in the region B may be lightly N-doped. For example, in comparison with extension or source/drain regions (not illustrated), a doping level on the order of $E17/cm^3$ may be implemented. In accordance with a special illustrative embodiment, the doping level of the active semiconductor layer 3 at least in the region B may be of about $1\ E17\ cm^{-3}$ to about $9\ E18\ cm^{-3}$, such as about $1\ E17\ cm^{-3}$ to about $9\ E17\ cm^{-3}$ or about $1\ E17\ cm^{-3}$ to about $5\ E17\ cm^{-3}$.

Figure 5:
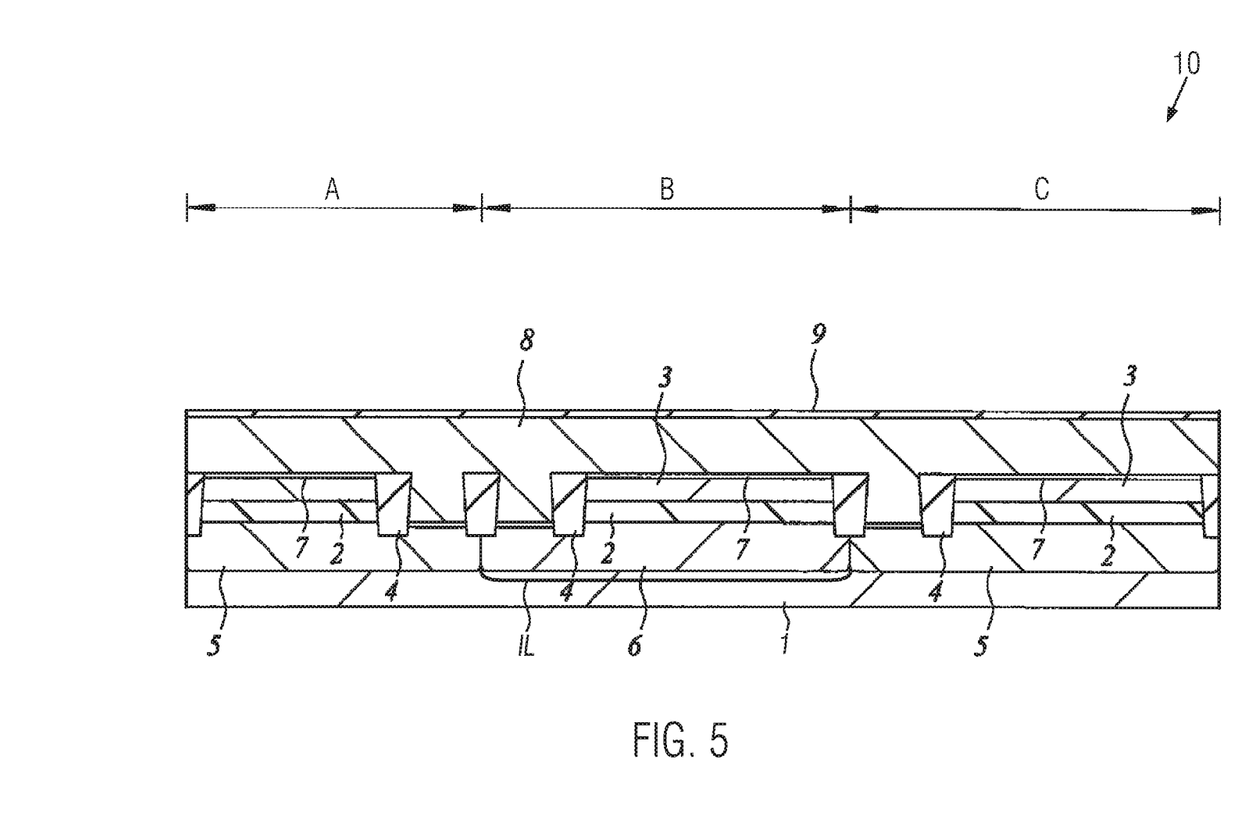

FIG. 5 schematically illustrates the semiconductor device structure 10 at a more advanced stage during fabrication, particularly after a gate structure-forming material sequence is deposited over the regions A, B and C. In accordance with some illustrative embodiments of the present disclosure, a gate dielectric material layer 7, including at least one of a silicon oxide material, a high-k material and possibly a work function-adjusting material, e.g., TiN and the like, is deposited on the exposed surfaces of the active semiconductor layer 3 and the back gate regions 5 and 6 in the regions A, B and C. For example, the gate dielectric material layer 7 may have a film thickness of 10 nm or less, e.g., 5 nm or less, or approximately at 2 nm. For example, the process of depositing the gate dielectric material layer 7 over the regions A, B and C may comprise performing a thermal oxidation of the surface of the active semiconductor layer 3 in the regions A to C and the surface of the back gate regions 5 and 6 of the regions A to C in the trenches 41 to 43 (see FIG. 4).

In a next step during fabrication, a gate electrode material layer 8 is deposited on the gate dielectric material layer 7, e.g., by chemical vapor deposition (CVD) methods, and an insulating material film 9 may be further formed on the gate electrode material layer 8 for gate protection by, for example, CVD methods. In accordance with some illustrative embodiments of the present disclosure, the gate electrode material layer 8 may comprise gate electrode materials that are conventionally used in the art of implementing HK/MG gate structures. Alternatively, the gate electrode material layer 8 may be polysilicon or amorphous silicon material.

Figure 6:
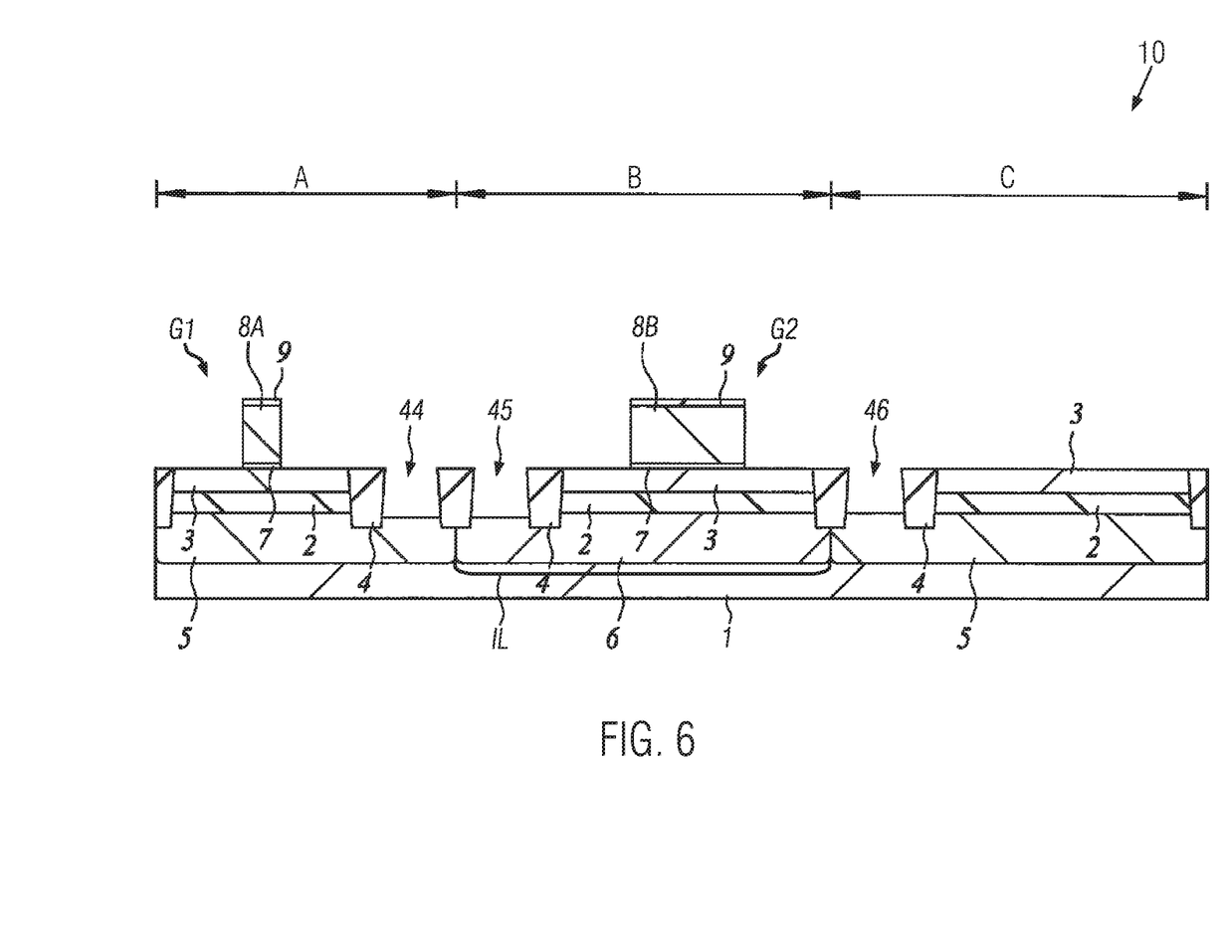

FIG. 6 schematically illustrates the semiconductor device structure 10 at a more advanced stage during fabrication, particularly after a dry etching of the deposited material layers 7, 8 and 9 on the regions A, B and C is performed. The person skilled in the art will appreciate that, according to appropriate masking techniques for forming a masking structure (not illustrated) after the dry etching process, the material layers 7, 8 and 9 may be removed from above the region C. This poses no limitation on the present disclosure and the person skilled in the art will appreciate that a gate structure corresponding to a gate structure G1 in the region A may be formed in the region C. Accordingly, a gate structure G2 is formed on the active semiconductor layer 3 in the region B. The gate structure G1 comprises a gate dielectric structure 7, a gate electrode material 8A and a gate cap 9. The gate structure G2 comprises a gate dielectric structure 7, a gate electrode material 8B and a gate cap 9. In accordance with illustrative embodiments of the present disclosure, at least one of the gate structures G1 and G2 is implemented as a high-k metal gate configuration.

Figure 7:
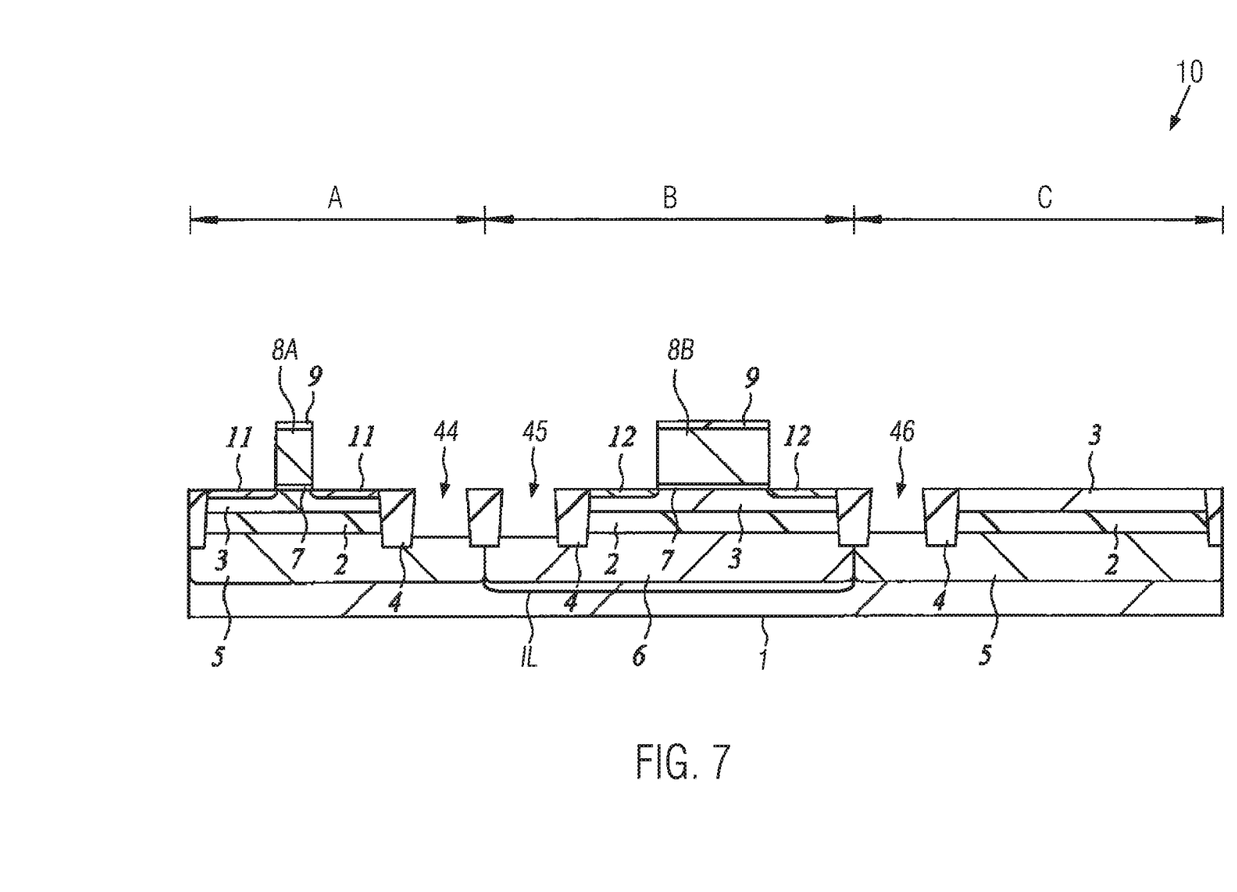

With regard to FIG. 7, the semiconductor device structure 10 is schematically illustrated at a more advanced stage during fabrication, particularly after strongly doped regions 11, 12 are formed by implanting dopants into the active semiconductor layer 3 in the regions A and B. As illustrated in FIG. 7, the active semiconductor layer 3 in the region C is not exposed to the implantation of dopants for forming strongly doped regions. This does not pose any limitation on the present disclosure and the person skilled in the art will appreciate that, particularly when a gate structure (not illustrated) is provided in the region C, the region C may be exposed to this implantation as well. In accordance with some illustrative embodiments of the present disclosure, the strongly doped regions 12 may be formed by injecting N-type dopants into the active semiconductor layer 3 of the region B. Alternatively, P-type dopants may be implanted into the active semiconductor layer 3 of the region B in alignment with the gate structure G2.

In accordance with some illustrative embodiments of the present disclosure, the strongly doped region 11 may be doped, either by P-type dopants or N-type dopants, depending on the type of semiconductor device to be implemented in the region A.

Figure 8:
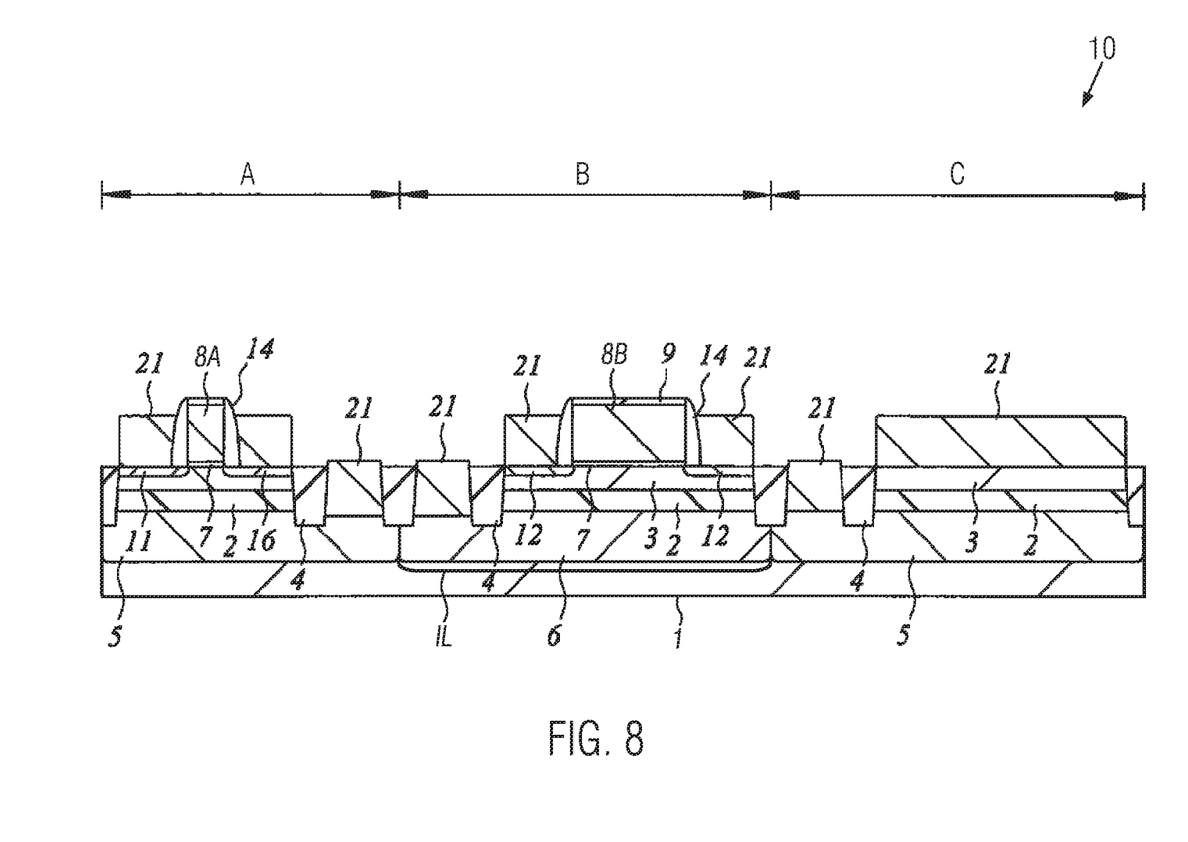

With regard to FIG. 8, the semiconductor device structure 10 is schematically illustrated at a more advanced stage during fabrication, particularly after sidewall spacers 14 are formed on respective sidewalls of the gate structure G1, G2 and a silicon epitaxial material 21 is grown on each surface of the strongly doped regions 11, 12, as well as on the active semiconductor layer 3 in the region C. Simultaneously, a silicon epitaxial material 21 is grown on the surface of the back gate regions 5 and 6 within the trenches 44 to 46 (see FIGS. 6 and 7). In accordance with illustrative embodiments of the present disclosure, the sidewall spacers 14 are formed by depositing an insulating sidewall spacer forming material (one or more layers), e.g., silicon oxide and/or silicon nitride, by using CVD methods, and dry etching the deposited insulating sidewall spacer forming material or insulating material layers. The person skilled in the art will appreciate that the sidewall spacers 14 encapsulate the gate structures G1, G2 and set a separation between the silicon epitaxial layer 21 and the gate electrode material 8A, 8B.

Figure 9:
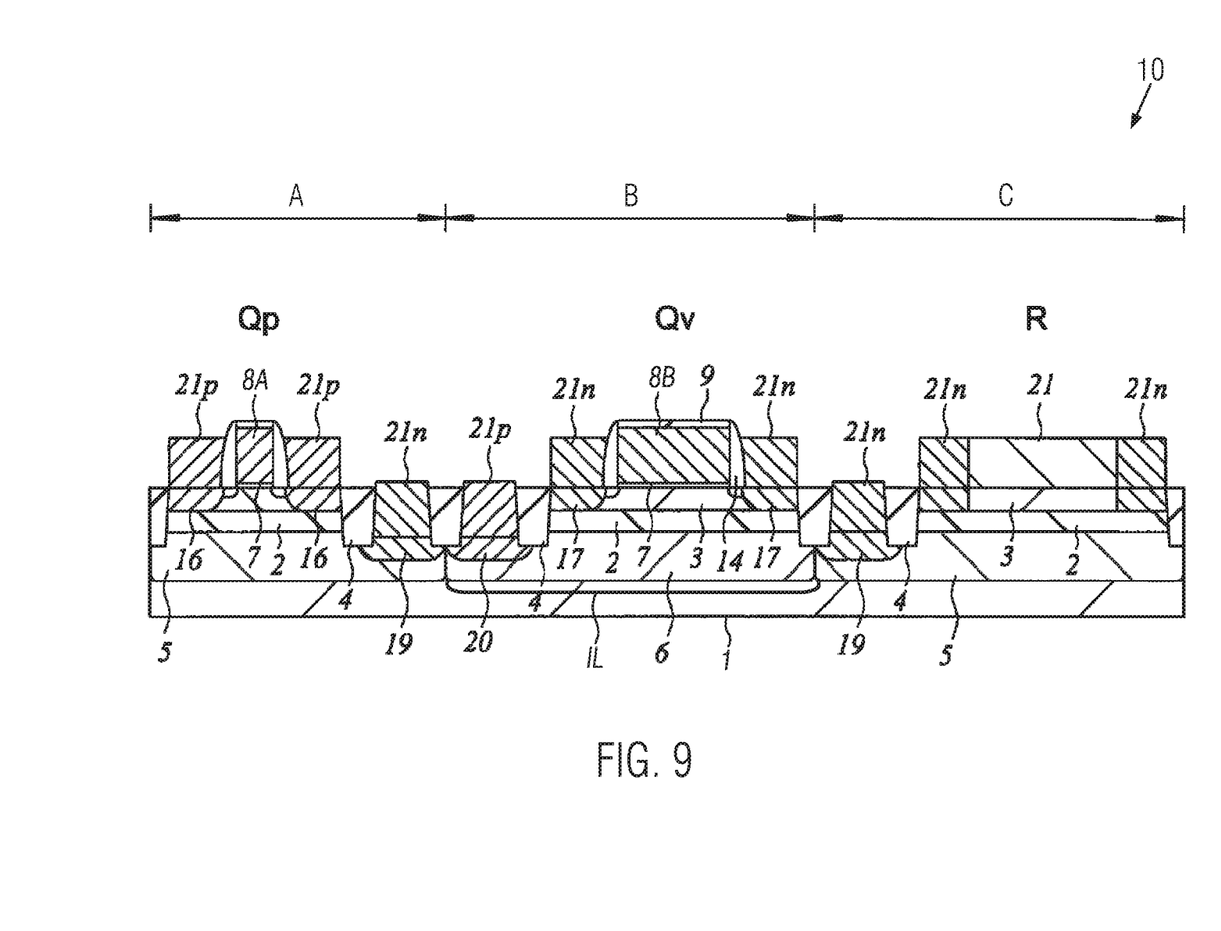

With regard to FIG. 9, the semiconductor device structure 10 is schematically illustrated at a more advanced stage during fabrication, particularly after an ion implantation has been carried out to form strongly doped regions 16, 17, 19 and 20 below the silicon epitaxial layer 21. Due to the implantation of dopants when forming the strongly doped regions 16, 17, 19 and 20, the silicon epitaxial layer 21 is accordingly doped in each of the regions A, B and C. By way of example, as illustrated in FIG. 9, when implanting P-type dopants into the semiconductor device to be implemented in the region A, P-doped silicon epitaxial layers 21p are formed. By accordingly implanting N-type dopants into the semiconductor device to be implemented in the region B, N-doped silicon epitaxial layers 21n may be formed. The person skilled in the art will appreciate that, depending on the conductivity type of the back gate region 5, the silicon epitaxial material filling up the trench 44 in FIG. 7 is doped with dopants matching the conductivity type of the back gate region 5. An according contact with the back gate region 6 is provided via the silicon epitaxial layer 21 filling up the trench 45 in FIG. 7. An according contacting structure to the back gate region 5 in the region C is provided. Accordingly, by way of the example illustrated in FIG. 9, the contact to the back gate regions 5, 6 are provided via the doped silicon epitaxial layer 21n and the strongly doped region 19 in region A, the P-type doped silicon epitaxial layer 21p in contact with the strongly doped region 20 within the back gate region 6 in region B and the N-type doped silicon epitaxial film 21n in contact with the strongly doped region 19 for contacting the back gate region 5 in region C.

The person skilled in the art will appreciate that the illustrative embodiment as depicted in FIG. 9 is not limiting to the present disclosure and, depending on the conductivity type of the respective back gate region 5, 6, a matching doping may be applied to the back gate contact regions 20, 19.

Furthermore, as depicted in FIG. 9, a resistor device R may be implemented in region C. The person skilled in the art will appreciate that the implantation of strongly doped region 21n in the silicon epitaxial layer 21 on the active semiconductor layer 3 is performed by appropriately doping the silicon epitaxial layer 21 disposed on the active semiconductor layer 3 in region C.

Although the semiconductor device fabricated in region A is implemented as a PMOS transistor Qp, the person skilled in the art will appreciate that this is not limiting to the present disclosure. By inverting the respective conductivity type of the silicon epitaxial layer 21p and the active semiconductor layer 3 in region A (an FDSOI set up), the active semiconductor layer 3 may remain undoped (an NMOS device may be implemented instead).

Figure 10:
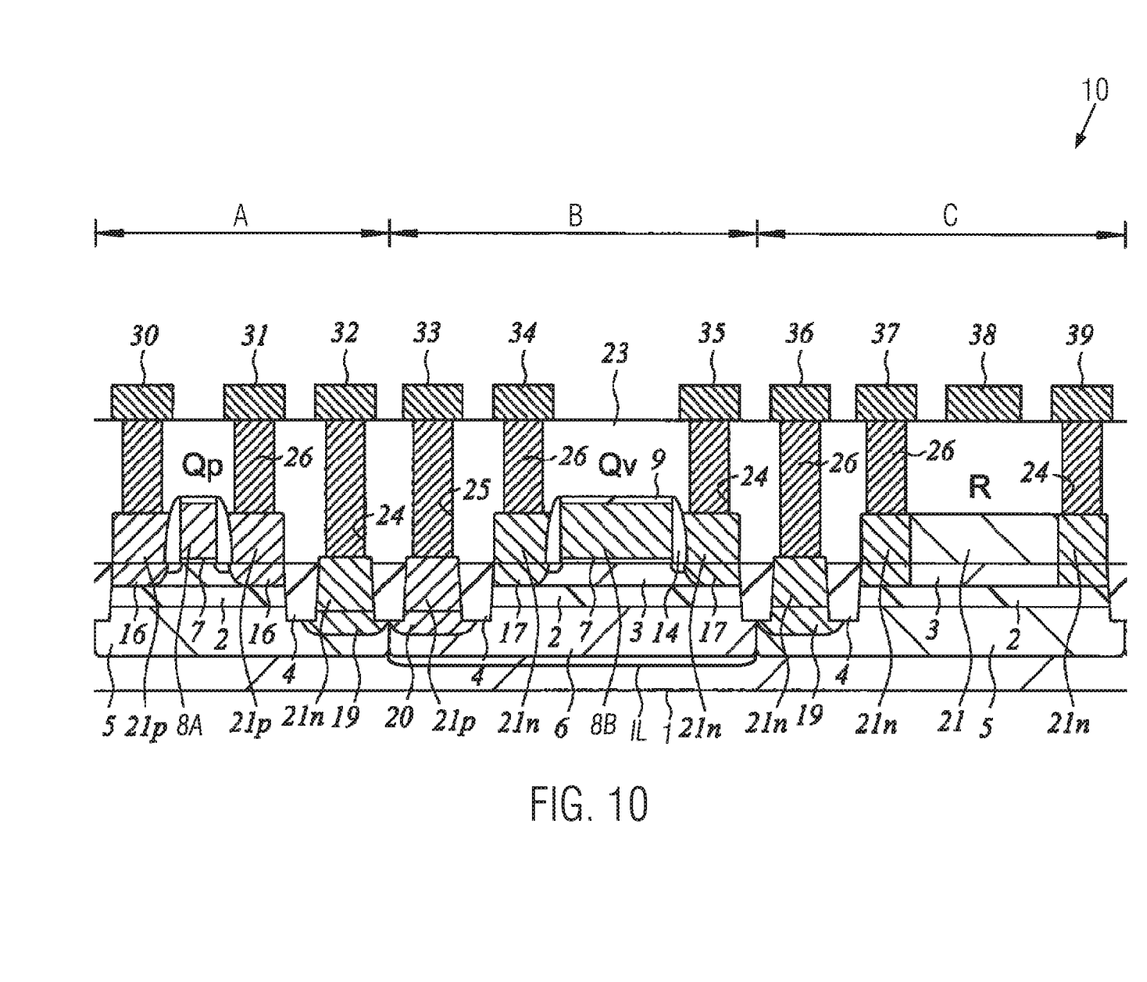

FIG. 10 schematically illustrates the semiconductor device structure 10 at a more advanced stage during fabrication, particularly after an interlayer dielectric 23 is deposited and contact structures for contacting the silicon epitaxial layers 21, i.e., the layers 21p, 21n, are formed.

In accordance with illustrative embodiments herein, a contact hole 24 exposing a surface of the silicon epitaxial layer 21n and a contact hole 25 exposing a surface of the silicon epitaxial layer 21p may be formed by dry etching the interlayer dielectric 23 in accordance with an appropriate masking pattern (not illustrated) to be formed in the interlayer dielectric layer 23.

Then, plugs 26 formed of a W-film and the like are formed inside the contact holes 24 and 25. Then, first layer wirings 30 to 39 may be formed, for example, of an Al alloy film and the like, on the interlayer dielectric 23. The first layer wiring 38 covering the resistor device R in region C serves as a shielding layer to prevent fluctuation of resistance values caused by an external induction field etc. The person skilled in the art will appreciate that subsequent processes for forming wirings are performed in accordance with well-known techniques, the illustration and description of which will be omitted in the following.

The person skilled in the art will appreciate that, although the resistor device R is formed by using the silicon epitaxial layer 21, this does not pose any limitation on the present disclosure. Instead, the resistor device R may be formed by using a polycrystalline silicon film, which is, in accordance with some illustrative embodiments, possibly used as a material of the gate electrodes G1, G2.

The person skilled in the art will appreciate that although the gate structures G1, G2 are formed of a polycrystalline silicon film in accordance with some illustrative embodiments, this poses no limitation on the present disclosure. Instead, the gate electrode materials may be formed by gate electrode metals or may be implemented as fully silicided gate electrodes as is known in the art. Herein, the resistor device R may be simultaneously formed using a process of forming the MOS transistor for a logic circuit.

With regard to the varactor device Qv as implemented in region B of FIG. 10, implementations as provided by the present disclosure may be summarized as presented in the table below:

|  | NCAP | | PCAP | |
| --- | --- | --- | --- | --- |
|  | N-depletion | N-accumulation | P-depletion | P-accumulation |
| S/D doping | N | N | P | P |
| Channel | Lightly N | Lightly N | Lightly P | Lightly P |
| Back gate doping | P | N | N | P |
| Back gate voltage | Vbg < 0 | Vbg > 0 | Vbg > 0 | Vbg < 0 |

The person skilled in the art will appreciate that by employing lightly doped channels (i.e., lightly doped active semiconductor layer 3 in region B of the figures) for the semiconductor device Qv, an inversion is impossible and only a change in accumulation properties is accomplished from accumulation to depletion in SOI implementations where the active semiconductor layer 3 of the SOI substrate on which the semiconductor device Qv is fabricated has a thickness in a range up to 10 nm.

The present disclosure provides for a flipping of back gate doping in the back gate region 6 of the semiconductor device Qv, e.g., from an N-type doping to a P-type doping and vice versa. In illustrative embodiments of the present disclosure, a P-type back gate may be typically biased by a negative voltage applied to the contact 33, 25, 21p, 20 in the region B. The person skilled in the art will appreciate that in case of N-type back gate setups, a positive voltage is supplied to the contact 33. Therefore, in case of N-type SOI layers, an N-type back gate can be implemented via the back gate region 6 to accumulate electrons in a capacitor formed in between the gate material 8B and the channel below the gate structure G2 in region B. In case of P-type back gates, a lightly doped N-type active semiconductor layer 3 in the region B can be depleted and the capacitance of the semiconductor device Qv can be reduced.

The person skilled in the art will appreciate that the semiconductor device Qv may be provided in accordance with conventional capacitor formation techniques, such as an N-type extension, well formation and gate formation. By implementing a lightly doped channel, the accumulation and depletion of charges in the capacitor of the semiconductor device Qv is enabled. By using the back gate region 6 with opposite doping, the sensitivity to the application of a back bias to the back gate region may be increased as a work function difference, thereby improving depletion.

The person skilled in the art will appreciate that it is also possible to use the same type doping for the back gate, wherein the capacitor layer, when doping levels are appropriately chosen, is enhanced.

The person skilled in the art will appreciate that, in accordance with some illustrative embodiments of the present disclosure, the isolation layer below the back gate region (at least in the region B) may be formed by implanting phosphor at an implantation energy of 519 keV and at a dose of about 1 E13 cm$^{-3}$ to 5 E13 cm$^{-3}$, such as at about 3 E13 cm$^{-3}$.

The person skilled in the art will appreciate that, in accordance with some illustrative embodiments of the present disclosure, the back gate region may be doped by implanting boron or indium at an implantation energy of at least 100 keV and an implantation density on the order of E13 cm$^{-2}$.

The present disclosure provides the following advantages:

A separate terminal for tuning the capacitance of a varicap is provided. Furthermore, by using a back gate of opposite doping, a back gate with steeper sensitivity is achieved. Accordingly, doped SOIs can be driven from accumulation to depletion without causing an effect on the front gate bias.

The present disclosure provides, in various illustrative embodiments, semiconductor device structures having superior leakage properties without a reverse junction leakage at advanced technology nodes. Particularly, the implementation of the present disclosure is, in accordance with some illustrative embodiments, performed with thin buried insulating material thicknesses, particularly below 20 nm.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
an SOI substrate comprising a base substrate material, an active semiconductor layer positioned above said base substrate material, and a buried insulating material layer positioned between said base substrate material and said active semiconductor layer, wherein said base substrate material comprises a P-type dopant material;

a gate structure positioned above said active semiconductor layer;

a back gate region positioned in said base substrate material below said gate structure and below said buried insulating material layer, wherein said back gate region comprises a P-type dopant material; and an isolation region electrically insulating said back gate region from said surrounding base substrate material, said isolation region comprising a plurality of implanted well regions that laterally contact and laterally enclose said back gate region and an implanted isolation layer that is formed below said back gate region, wherein said implanted isolation region comprises an N-type dopant material.

2. The semiconductor device of claim 1, wherein said back gate region is doped with one of boron and indium.

3. The semiconductor device of claim 1, wherein a region of said active semiconductor layer below said gate structure is a first N-doped region.

4. The semiconductor device of claim 3, wherein said first N-doped region has a doping concentration in a range of approximately E17 $cm^{-3}$ to E18 $cm^{-3}$.

5. The semiconductor device of claim 3, further comprising second N-doped regions that contact said first N-doped region within said active semiconductor layer, wherein said second N-doped regions are substantially aligned with said gate structure so as to form a capacitor structure between said gate structure and said first N-doped region.

6. The semiconductor device of claim 1, further comprising a ground contact coupling said base substrate material to a grounding line and a back bias contact coupling said back gate structure to a potential different from ground.

7. The semiconductor device of claim 1, wherein a region of said active semiconductor layer below said gate structure is a P-doped region and said back gate region is an N-doped region embedded into said base substrate material below said buried insulating material layer.

8. A semiconductor device, comprising:

an SOI substrate comprising a base substrate material, an active semiconductor layer positioned above said base substrate material, and a buried insulating material layer positioned between said base substrate material and said active semiconductor layer;

a doped back gate region positioned below said buried insulating material layer, said doped back gate region comprising dopant of a first conductivity type;

a plurality of doped well regions positioned in said base substrate material that laterally enclose said doped back gate region, wherein said plurality of doped well regions are doped with dopant of a second conductivity type that is opposite to said first conductivity type;

a doped isolation region positioned in said base substrate material below said doped back gate region, wherein said doped isolation region is doped with dopant of said second conductivity type; and a gate structure positioned above said active semiconductor layer and over said doped back gate region.

9. The semiconductor device of claim 8, wherein said doped isolation region has a concentration of said dopant of said second conductivity type of about 3 E13 cm-3.

10. The semiconductor device of claim 8, wherein said base substrate material and said doped back gate region comprise P-type dopant materials, said plurality of doped well regions comprise an N-type dopant material, and said doped isolation region comprises an N-type dopant material.

11. The semiconductor device of claim 8, further comprising a first doped region positioned within said active semiconductor layer, wherein said first doped region comprises dopant of said second conductivity type having a dopant concentration that falls within a range of E17 $cm^{-3}$ to E18 $cm^{-3}$.

12. The semiconductor device of claim 11, further comprising second doped regions that contact said first doped region within said active semiconductor layer, said second doped regions being substantially aligned with said gate structure so as to form a capacitor structure between said gate structure and said first doped region.

13. The semiconductor device of claim 12, wherein said second doped regions comprise dopant of said second conductivity type having a dopant concentration that is greater than said concentration of said dopant of said second conductivity type in said first doped region.

14. The semiconductor device of claim 8, wherein said back gate region is doped with one of boron and indium.

15. The semiconductor device of claim 8, further comprising a ground contact coupling said base substrate material to a grounding line and a back bias contact coupling said back gate structure to a potential different from ground.

16. The semiconductor device of claim 8, wherein a region of said active semiconductor layer below said gate structure is a first P-doped region and said back gate region is an N-doped region embedded into said base substrate material below said buried insulating material layer.

17. A semiconductor device, comprising:

an SOI substrate comprising a base substrate material, an active semiconductor layer positioned above said base substrate material, and a buried insulating material layer positioned between said base substrate material and said active semiconductor layer;

a doped back gate region positioned in said base substrate material, said doped back gate region comprising dopant of a first conductivity type;

a plurality of doped well regions positioned in said base substrate material that laterally enclose said doped back gate region, wherein said plurality of doped well regions comprise dopant of a second conductivity type that is opposite to said first conductivity type;

a doped isolation region positioned in said base substrate material below said doped back gate region, wherein said doped isolation region comprises dopant of said second conductivity type;

a gate structure positioned above said active semiconductor layer and over said doped back gate region;

a first doped region positioned within said active semiconductor layer, wherein said first doped region comprises dopant of said second conductivity type; and second doped regions that contact said first doped region within said active semiconductor layer, said second doped regions being substantially aligned with said gate structure so as to form a capacitor structure between said gate structure and said first doped region, wherein said second doped regions comprise dopant of said second conductivity type and have a dopant concentration that is greater than a concentration of said dopant of said second conductivity type in said first doped region.

* * * * *